United States Patent
Lee et al.

(10) Patent No.: US 12,199,055 B2
(45) Date of Patent: Jan. 14, 2025

(54) BONDING DEVICE

(71) Applicant: Samsung Display Co., Ltd., Yongin-si (KR)

(72) Inventors: Hyunwoo Lee, Seongnam-si (KR); Jungseon Park, Cheonan-si (KR); Taeyoung Park, Anyang-si (KR); Jun-Hee Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 928 days.

(21) Appl. No.: 17/116,902

(22) Filed: Dec. 9, 2020

(65) Prior Publication Data

US 2021/0305183 A1     Sep. 30, 2021

(30) Foreign Application Priority Data

Mar. 24, 2020   (KR) ................. 10-2020-0035764

(51) Int. Cl.
*H01L 23/00*       (2006.01)
*H05K 1/14*        (2006.01)

(52) U.S. Cl.
CPC ............ *H01L 24/05* (2013.01); *H05K 1/147* (2013.01)

(58) Field of Classification Search
CPC ............................... H01L 24/05; H05K 1/147
See application file for complete search history.

(56) References Cited

U.S. PATENT DOCUMENTS

| | | | | |
|---|---|---|---|---|
| 2009/0065120 A1* | 3/2009 | Ueno | ............... | H05K 13/0469 156/64 |
| 2011/0023296 A1* | 2/2011 | Muraoka | ............... | H01L 24/75 29/832 |
| 2017/0358602 A1* | 12/2017 | Bae | ............... | H05K 1/117 |
| 2019/0375041 A1* | 12/2019 | Sunaga | ............... | G02F 1/1345 |

FOREIGN PATENT DOCUMENTS

| | | | | |
|---|---|---|---|---|
| JP | 2002040459 | | 2/2002 | |
| JP | 2018029172 A | * | 2/2018 | ........... G02F 1/1303 |
| KR | 10-0828315 | | 5/2008 | |
| KR | 10-2008-0089843 | | 10/2008 | |
| KR | 10-0945002 | | 3/2010 | |
| KR | 10-1399973 | | 6/2014 | |
| KR | 10-2014-0131644 | | 11/2014 | |
| KR | 10-2025192 | | 9/2019 | |
| WO | 2009/122711 | | 10/2009 | |

OTHER PUBLICATIONS

Translation of JP-2018029172-A, Feb. 2018, Noda A (Year: 2018).*

* cited by examiner

*Primary Examiner* — George R Koch
(74) *Attorney, Agent, or Firm* — KILE PARK REED & HOUTTEMAN PLLC

(57) ABSTRACT

A bonding device includes a stage supporting a display panel including a first area through which a pad is exposed, a sensor disposed on the stage and facing the first area, and a handler disposing a circuit board on the first area. The handler includes a body supporting the circuit board and a rod connected to the body and selectively in contact with a second area of the circuit board overlapping the first area.

18 Claims, 10 Drawing Sheets

BONDING DEVICE

CROSS-REFERENCE TO RELATED APPLICATION

This application claims priority from and the benefit of Korean Patent Application No. 10-2020-0035764, filed on Mar. 24, 2020, which is hereby incorporated by reference for all purposes as if fully set forth herein.

BACKGROUND

Field

The inventive concepts relate to a bonding device. More particularly, the inventive concepts relate to a bonding device capable of more accurately aligning a circuit board on a side surface of a display panel.

Discussion of the Background

In general, a display device includes a display panel including pixels and a driving chip driving the pixels. The driving chip is disposed on a flexible film, and the flexible film is connected to the display panel. The driving chip is connected to the pixels of the display panel through the flexible film. This connection method is defined as a chip-on-film method.

Pads connected to the driving chip are disposed on the flexible film, and the display panel includes connection pads connected to the pixels. As the pads are respectively connected to the connection pads, the driving chip is connected to the pixels.

In recent years, a technique that bonds a driver to a side surface of the display panel is being developed to reduce a bezel area.

The above information disclosed in this Background section is only for understanding of the background of the inventive concepts, and, therefore, it may contain information that does not constitute prior art.

SUMMARY

The inventive concepts provide a bonding device capable of more accurately aligning a circuit board on a side surface of a display panel.

Additional features of the inventive concepts will be set forth in the description which follows, and in part will be apparent from the description, or may be learned by practice of the inventive concepts.

Embodiments of the inventive concept provide a bonding device including a stage supporting a display panel including a first area through which a pad is exposed, a sensor disposed on the stage and facing the first area, and a handler disposing a circuit board on the first area. The handler includes a body supporting the circuit board and a rod connected to the body and being selectively in contact with a second area of the circuit board overlapping the first area.

Embodiments of the inventive concept provide a bonding device including a stage including a support surface extending in a vertical direction, a camera disposed on the stage, and a handler disposed between the stage and the camera. The handler includes a body and a contact tip connected to the body and moving in one direction to be disposed on the stage.

According to the above, the handler that places the circuit board in the first area of the display panel includes the rod, and the rod is selectively in contact with the second area of the circuit board, which overlaps the first area. The rod accurately controls the alignment between the first area of the display panel and the second area of the circuit board.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
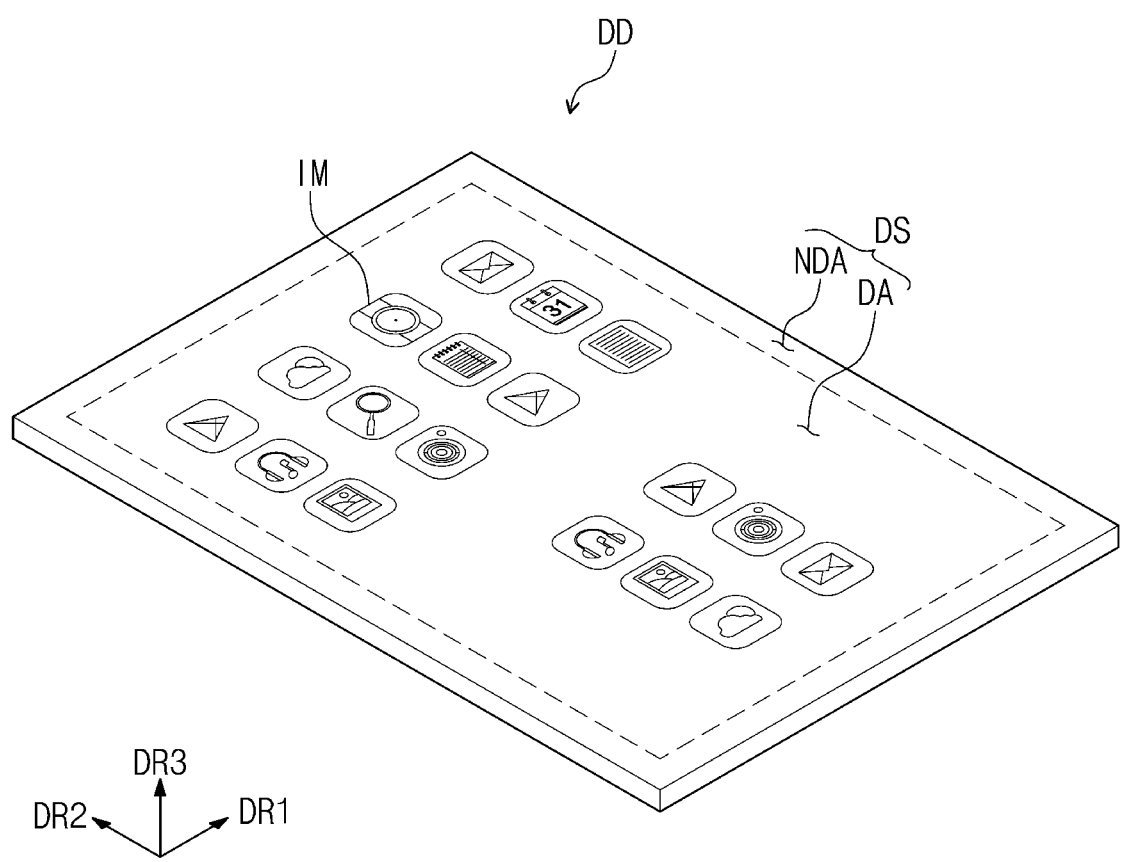
FIG. 1 is a perspective view illustrating a display device according to an embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are illustrated in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

In the present disclosure, it will be understood that when an element or layer is referred to as being "on", "connected to" or "coupled to" another element or layer, it can be directly on, connected or coupled to the other element or layer or intervening elements or layers may be present. To this end, the term "connected" may refer to physical, electrical, and/or fluid connection, with or without intervening elements.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprise," "comprising," "includes," and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the inventive concepts will be explained in detail with reference to the accompanying drawings.

FIG. 1 is a perspective view illustrating a display device DD according to an embodiment of the inventive concepts.

Referring to FIG. 1, the display device DD according to the embodiment of the inventive concepts may have a board shape defined by short sides extending in a first direction DR1 and long sides extending in a second direction DR2 crossing the first direction DR1. Hereinafter, the expression "when viewed in a plane" may mean a state of being viewed in a third direction DR3 that is perpendicular to a plane defined by the first direction DR1 and the second direction DR2. When viewed in the plane, the display device DD may have a rectangular shape, however, it should not be limited thereto or thereby. The display device DD may have a variety of shapes, such as a circular shape or a polygonal shape.

An upper surface of the display device DD may be defined as a display surface DS and may be a plane defined by the first direction DR1 and the second direction DR2. Images IM generated by the display device DD may be provided to a user through the display surface DS.

The display surface DS may include a display area DA and a non-display area NDA around the display area DA. The display area DA may display the images, and the non-display area NDA may not display the images. The non-display area NDA may surround the display area DA and may define a bezel area of the display device DD.

Figure 2:
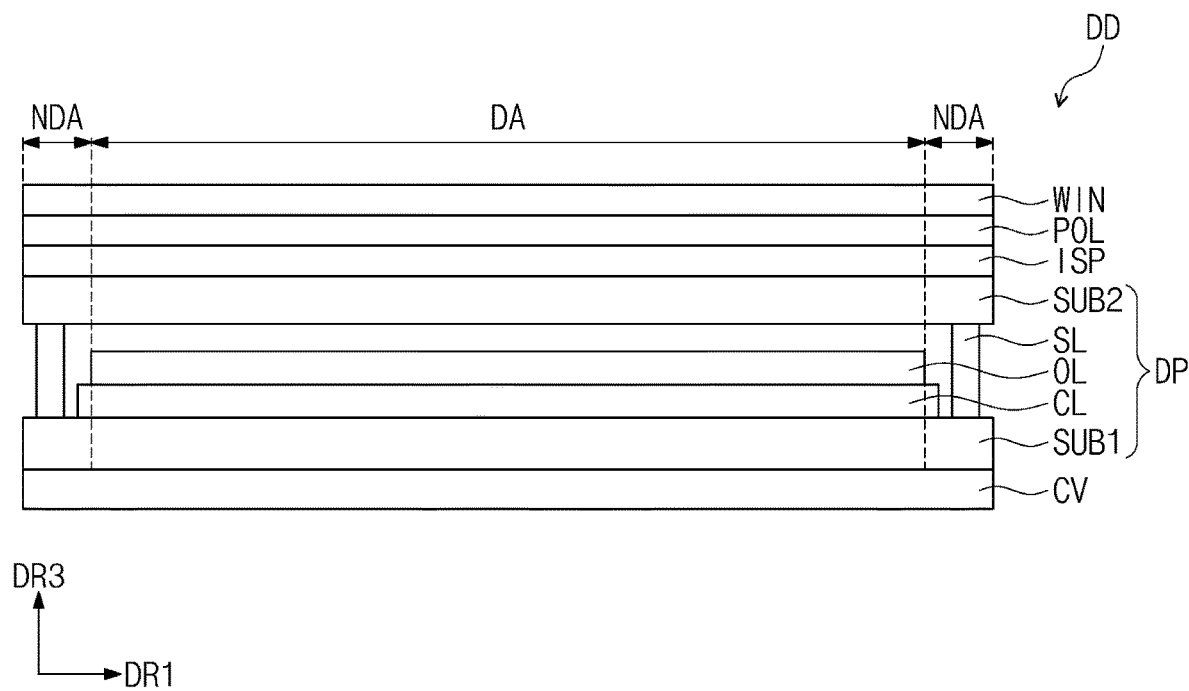
FIG. 2 is a cross-sectional view illustrating the display device of FIG. 1.

FIG. 2 is a cross-sectional view illustrating the display device DD of FIG. 1.

Referring to FIG. 2, the display device DD may include a display panel DP, an input sensing unit ISP disposed on the display panel DP, an anti-reflective layer POL disposed on the input sensing unit ISP, a window WIN disposed on the anti-reflective layer POL, and a cover panel CV disposed under the display panel DP.

The display panel DP according to the embodiment of the inventive concepts may be a light emitting type display panel, however, it should not be particularly limited. For example, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. As another way, the display panel DP may be a liquid crystal display panel including a liquid crystal layer. In the present embodiment, the organic light emitting display panel will be described as the display panel DP.

The display panel DP may include a first substrate SUB1, a second substrate SUB2, a circuit element layer CL, a display element layer OL, and a sealing layer SL.

The first substrate SUB1 may be a rigid substrate. For example, the first substrate SUB1 may be a glass substrate. The first substrate SUB1 may include a display area DA and a non-display area NDA surrounding the display area DA. The display area DA and the non-display area NDA of the first substrate SUB1 may substantially correspond to the display area DA and the non-display area NDA of the display surface DS illustrated in FIG. 1, respectively.

The second substrate SUB2 may be disposed on the first substrate SUB1. A lower surface of the second substrate SUB2 may face an upper surface of the first substrate SUB1. In the present embodiment, the second substrate SUB2 may be an encapsulation substrate. For example, the second substrate SUB2 may include a glass substrate.

The circuit element layer CL and the display element layer OL may be disposed between the first substrate SUB1 and the second substrate SUB2. The circuit element layer CL may include an insulating layer, a semiconductor pattern, a conductive pattern, and a signal line. An insulating layer, a semiconductor layer, and a conductive layer may be formed on the first substrate SUB1 by coating and deposition processes, and then, the insulating layer, the semiconductor layer, and the conductive layer may be selectively patterned by a plurality of photolithography processes. Then, the semiconductor pattern, the conductive pattern, and the signal line of the circuit element layer CL may be formed. For example, the signal line may be a data line or a scan line.

The display element layer OL may be disposed on the display area DA. The display element layer OL may include a light emitting element. For example, the display element layer OL may include an organic light emitting material, a quantum dot, a quantum rod, or a micro-LED.

The sealing layer SL may be disposed between the first substrate SUB1 and the second substrate SUB2. The sealing layer SL may be disposed outside the display element layer OL and the circuit element layer CL. The sealing layer SL may overlap the non-display area NDA. For example, the sealing layer SL may extend along an edge of the first substrate SUB1 and the second substrate SUB2. The sealing layer SL may include an insulating material. For example, the sealing layer SL may include a glass material.

The second substrate SUB2 and the sealing layer SL may protect the display element layer OL disposed on the first substrate SUB1 from the outside. For example, the second substrate SUB2 and the sealing layer SL may prevent external moisture from entering the display element layer OL disposed on the first substrate SUB1 and may prevent defects in the light emitting element.

However, the display panel DP may not necessarily include the second substrate SUB2 and the sealing layer SL. For instance, the display panel DP may include a thin film encapsulation layer instead of the second substrate SUB2 and the sealing layer SL. For example, the thin film encapsulation layer may be disposed on the circuit element layer CL to cover the display element layer OL. The thin film encapsulation layer may include an inorganic layer, an organic layer, and an inorganic layer, which are sequentially stacked. The inorganic layers may include an inorganic material and may protect the display element layer OL from moisture and oxygen. The organic layer may include an organic material and may protect the display element layer OL from a foreign substance such as a dust particle.

The input sensing unit ISP may be disposed on the display panel DP. The input sensing unit ISP may sense an external input, e.g., a user's touch, may convert the external input to a predetermined input signal, and may provide the input signal to the display panel DP. The input sensing unit ISP may include a plurality of sensing electrodes to sense the external input. The sensing electrodes may sense the external input by a capacitive method. The display panel DP may receive the input signal from the input sensing unit ISP and may generate an image corresponding to the input signal.

The anti-reflective layer POL may be disposed on the input sensing unit ISP. The anti-reflective layer POL may reduce a reflectance of an external light incident to the display panel DP from the outside of the display device DD. As an example, the anti-reflective layer POL may include a retarder and/or a polarizer.

The window WIN may protect the display panel DP and the input sensing unit ISP from external scratches and impacts. The window WIN may be attached to the input sensing unit ISP by an adhesive (not illustrated). The adhesive may include an optical clear adhesive. The image generated by the display panel DP may be provided to the user through the window WIN.

The cover panel CV may be disposed under the display panel DP. The cover panel CV may include one or more functional layers. For example, the cover panel CV may include a cushion layer. The cushion layer may be a synthetic resin foam that includes a matrix member and a plurality of voids. The voids may easily absorb impacts applied to the display panel DP.

Figure 3:
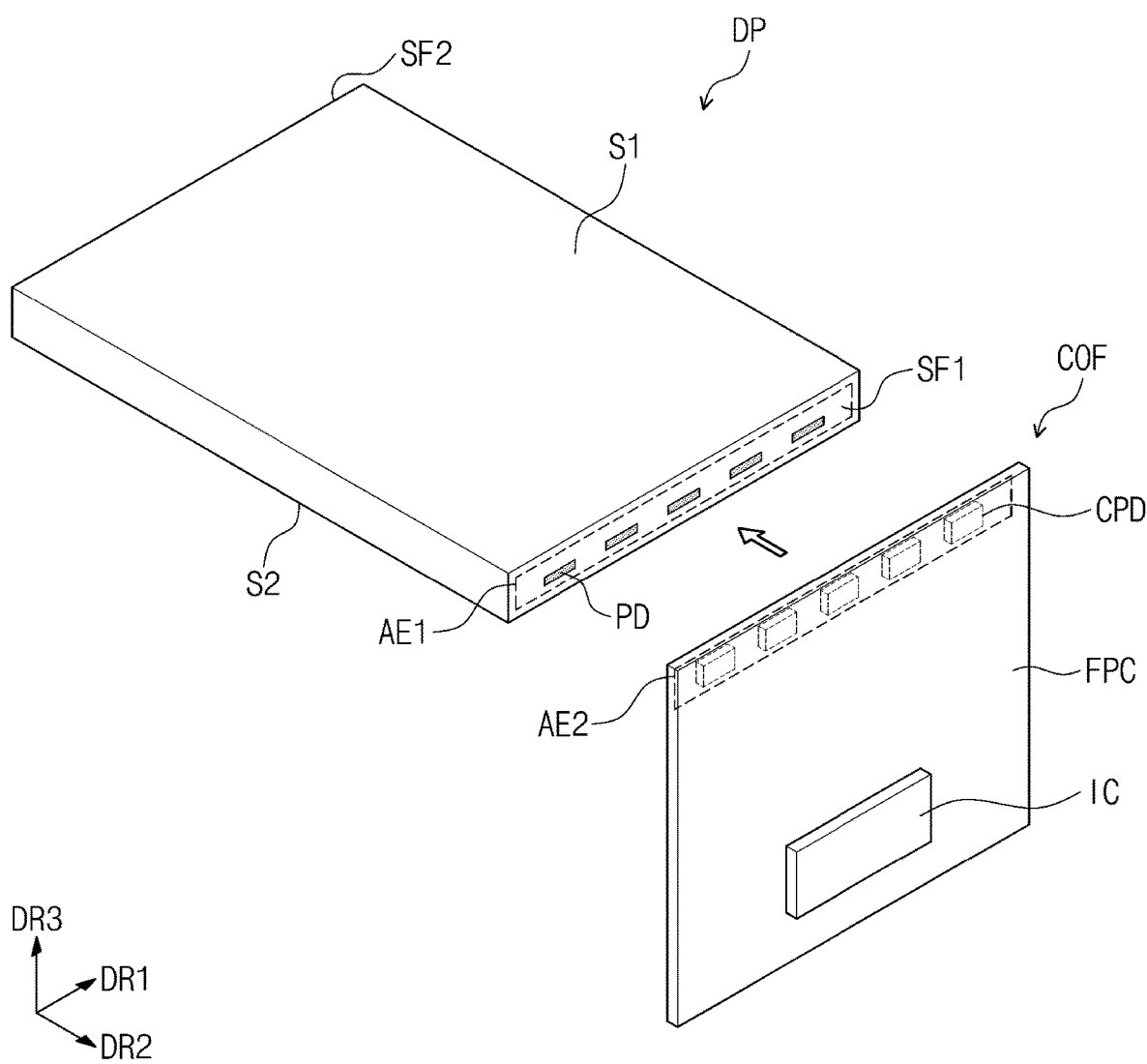
FIG. 3 is a view illustrating a display panel of a display device and a circuit board disposed on a side surface of the display panel according to an embodiment of the inventive concepts.

FIG. 3 is a view illustrating the display panel DP of the display device and a circuit board COF disposed on a side surface of the display panel DP according to an embodiment of the inventive concepts. For the convenience of explanation, FIG. 3 schematically illustrates a stacked structure of the display panel DP.

Referring to FIG. 3, the display panel DP may include a first surface S1, a second surface S2, a first side surface SF1, and a second side surface SF2 opposite the first side surface SF1. The first surface S1 may define an upper surface of the display panel DP. The first surface S1 may be a surface through which the image is displayed in the display panel DP. The first surface S1 may correspond to the display surface DS illustrated in FIG. 1. The second surface S2 may define a lower surface of the display panel DP. The second surface S2 may be opposite to the first surface S1 in the display panel DP.

The first side surface SF1 may be substantially perpendicular to the first surface S1 and the second surface S2. The first side surface SF1 may be substantially parallel to a plane defined by the first direction DR1 and the third direction DR3. A first area AE1 may be defined in the first side surface SF1. A plurality of pads PD may be disposed in the first area AE1. The pads PD may be spaced apart from each other in the first direction DR1.

The pads PD may be connected to the signal line. For example, the pads PD may be disposed on the first substrate SUB1 and may be connected to the signal line (refer to FIG. 2) of the circuit element layer CL. For example, each of the pads PD may be connected to a corresponding data line. The pads PD disposed in the first area AE1 may be exposed to the outside of the display panel DP.

FIG. 3 illustrates five pads PD disposed in the first area AE1, however, this is merely exemplary, and the number of the pads PD disposed in the first area AE1 may be greater than five. The second side surface SF2 may be opposite to the first side surface SF1.

The circuit board COF may be a driver that generates signals and applies the generated signals to the pads PD. For example, the circuit board COF may generate data signals and may apply the data signals to the data lines of the circuit element layer CL (refer to FIG. 2) through the pads PD.

The circuit board COF may include connection pads CPD, a flexible circuit board FPC, and a driving chip IC. The connection pads CPD may be disposed on one surface of the flexible circuit board FPC. A portion of the flexible circuit board FPC on which the connection pads are disposed may be defined as a second area AE2. One surface of the second area AE2 may face the first side surface SF1 of the display panel DP.

The connection pads CPD may be disposed to correspond to the pads PD. In detail, the connection pads CPD may be spaced apart from each other in the first direction DR1. The connection pads CPD may be electrically connected on an one-to-one basis to the pads PD, respectively.

The flexible circuit board FPC may be a flexible substrate. For example, a portion of the flexible circuit board FPC may be bent to be disposed under the second surface S2 of the display panel DP. The flexible circuit board FPC may include a transparent material.

The driving chip IC may be disposed on an opposite surface of the flexible circuit board FPC. When bent, the driving chip IC may be folded under the second surface S2. The opposite surface of the flexible circuit board FPC may be opposite to the one surface on which the connection pads CPD are disposed.

When viewed in the second direction DR2, the second area AE2 of the circuit board COF may overlap the first area AE1 of the display panel DP. In more detail, when viewed in the second direction DR2, each of the connection pads CPD may overlap a corresponding pad PD. When viewed in the second direction DR2, each of the connection pads CPD may have an area greater than an area of the pad PD.

According to the embodiment of the inventive concepts, the circuit board COF connected to the signal line through the pads PD may be connected to the first side surface SF1 of the display panel DP, and thus, a size of a bezel portion of the display device DD may be reduced.

Figure 4:
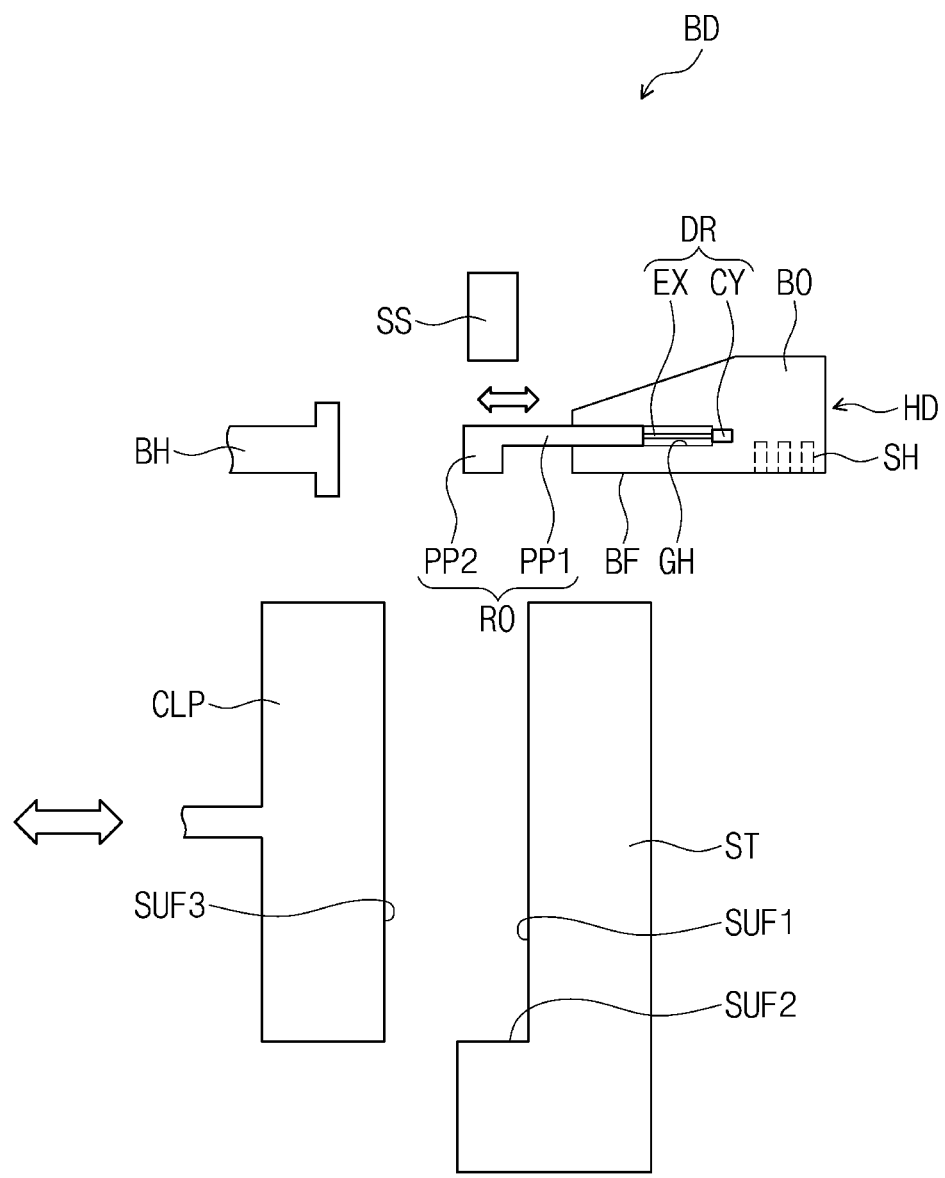
FIG. 4 is a view illustrating a bonding device according to an embodiment of the inventive concepts.

FIG. 4 is a view illustrating a bonding device BD according to an embodiment of the inventive concepts. The bonding device BD illustrated in FIG. 4 may be used to fix the circuit board COF of FIG. 3 to the first side surface SF1 of the display panel DP.

Referring to FIGS. 3 and 4, the bonding device BD may include a stage ST, a clamper CLP, a sensor SS, a handler HD, and a bonding head BH.

A target object may be disposed on the stage ST. For instance, the target object may be the display panel DP illustrated in FIG. 3. The stage ST may have sufficient rigidity. For example, the stage ST may include a metal material.

The stage ST may include a first support surface SUF1 and a second support surface SUF2. The first support surface SUF1 may be substantially parallel to a vertical direction (e.g., the third direction DR3). For example, the first support surface SUF1 may be substantially parallel to a plane defined by the second direction DR2 and the third direction DR3. The second surface S2 of the display panel DP illustrated in FIG. 3 may be placed on the first support surface SUF1.

The second support surface SUF2 may be substantially parallel to a horizontal direction (e.g., the first direction DR1 or the second direction DR2). For example, the second support surface SUF2 may be substantially parallel to a plane defined by the first direction DR1 and the second direction DR2. The second support surface SUF2 may be substantially perpendicular to the first support surface SUF1. The second side surface SF2 of the display panel DP illustrated in FIG. 3 may be placed on the second support surface SUF2.

The clamper CLP may be spaced apart from the stage ST in the first direction DR1. The clamper CLP may include a third support surface SUF3. The third support surface SUF3 may face the first support surface SUF1. The third support surface SUF3 may be substantially parallel to the first support surface SUF1. The second support surface SUF2 may be disposed between the first support surface SUF1 and the third support surface SUF3 in the first direction DR1.

The clamper CLP may move in the first direction DR1. For example, the clamper CLP may move to be close to or far away from the stage ST. In other words, a distance between the third support surface SUF3 and the first support surface SUF1 may vary when the clamper CLP moves.

The sensor SS may be disposed on the stage ST. The sensor SS may face the second support surface SUF2 of the stage ST. When viewed in the plane, the sensor SS may overlap the second support surface SUF2. The sensor SS may take an image of a mark made on the target object disposed on the stage ST. For example, the sensor SS may be a camera.

The handler HD may be disposed between the stage ST and the sensor SS. The handler HD may be used to dispose the circuit board COF illustrated in FIG. 3. The handler HD may include a body BO and a rod RO connected to the body BO.

A lower surface BF of the body BO may be substantially parallel to the horizontal direction. For example, the lower surface BF may be substantially parallel to a plane defined by the first direction DR1 and the second direction DR2. A plurality of suction holes SH may be defined in the lower surface BF of the body BO. When air around the lower surface BF of the body BO is sucked by the suction holes SH, a suction force may occur on the lower surface BF of the body BO.

A guide groove GH may be defined in the body BO. The guide groove GH may extend in the horizontal direction. For example, the guide groove GH may extend in a direction from one surface of the body BO to an opposite surface to the one surface in the first direction DR1.

The rod RO may be connected to the body BO to move in one direction. The rod RO may include a first portion PP1 and a second portion PP2. The first portion PP1 may be disposed in the body BO and extend in the horizontal direction. At least a portion of the first portion PP1 may be inserted into the guide groove GH. The first portion PP1 may move along the first direction DR1 in the guide groove GH.

The second portion PP2 may extend from the first portion PP1 and may be disposed outside the body BO. The second portion PP2 may extend in a downward direction, e.g., a direction opposite to the third direction DR3, from the first portion PP1. Accordingly, a lower surface of the second portion PP2 may protrude further than a lower surface of the first portion PP1 to the downward direction. The second portion PP2 may be a contact tip. For example, the second portion PP2 may be in contact with the second area AE2 of the circuit board COF illustrated in FIG. 3. This will be further described later.

The handler HD may further include a driver DR. The driver DR may control a position of the rod RO. For example, the driver DR may include a cylinder CY and an extension portion EX connected to the cylinder CY.

The cylinder CY may be disposed in the guide groove GH. The extension portion EX may be disposed between the cylinder CY and the first portion PP1 of the rod RO. One end of the extension portion EX may be connected to the first portion PP1. When the extension portion EX extends near the cylinder CY, the second portion PP2 of the rod RO may be far away from the body BO and may be disposed on the stage ST. In this case, the second portion PP2 may overlap the sensor SS and the second support surface SUF2. When the extension portion EX is extracted by the cylinder CY, the second portion PP2 of the rod RO may be disposed at a position adjacent to the body BO. In this case, the second portion PP2 may not overlap the sensor SS and the second support surface SUF2. However, a method of moving the rod RO by the driver DR should not be limited thereto or thereby.

The rod RO may include a transparent material. For example, the rod RO may include quartz. Accordingly, when the second portion PP2 of the rod RO overlaps the sensor SS, the sensor SS may take an image of an object disposed under the second portion PP2 of the rod RO. However, a material for the rod RO should not be limited thereto or thereby, and the rod RO may include another transparent material other than quartz.

The bonding head BH may be disposed on the stage ST. The bonding head BH may bond the circuit board COF to the first side surface SF1 of the display panel DP illustrated in FIG. 3. For example, the bonding head BH may bond the circuit board COF to the first side surface SF1 of the display panel DP using one of a thermal-compression method, an ultrasonic method, and a laser beam method.

In detail, the bonding head BH may include a pressure tip and a heater to apply a predetermined pressure and heat to the flexible circuit board. As another way, the bonding head BH may include an ultrasonic generator and an ultrasonic irradiation unit to apply ultrasonic waves having a predetermined wavelength to between the connection pad CPD and the pad PD. As another way, the bonding head BH may include a laser irradiation unit to irradiate a laser beam to between the connection pad CPD and the pad PD. However, the method of fixing the circuit board COF to the display panel DP using the bonding head BH should not be limited thereto or thereby.

FIGS. 5 to 8 are views illustrating a process of bonding a circuit board to a side surface of a display panel of FIG. 3 using a bonding device according to an embodiment of the inventive concepts. A first mark MK1 and a second mark MK2 may be respectively defined in the first area AE1 and the second area AE2, and each of the first and second marks MK1 and MK2 may be an imaginary designated dot or line.

Figure 5:
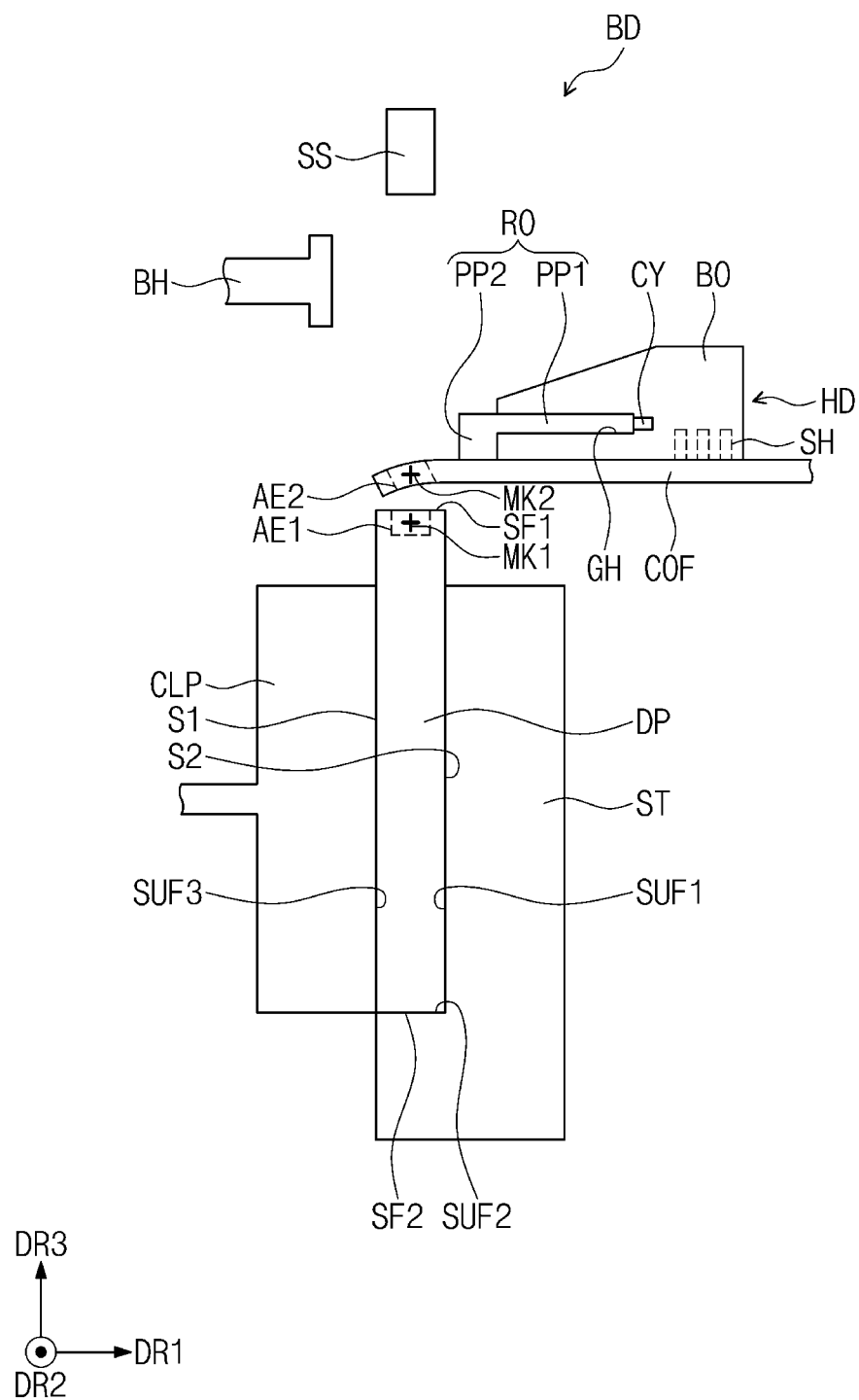
FIG. 5, FIG. 6, FIG. 7 and FIG. 8 are views illustrating a process of bonding the circuit board to the side surface of the display panel of FIG. 3 using a bonding device according to an embodiment of the inventive concepts.

Referring to FIGS. 3 and 5, the display panel DP may be placed on the stage ST. The stage ST may support the display panel DP. In detail, the second surface S2 of the display panel DP may be placed on the first support surface SUF1 of the stage ST. The first support surface SUF1 may support the display panel DP in the first direction DR1. For example, the stage ST may fix the display panel DP to the first support surface SUF1 using a vacuum adsorption method. The second side surface SF2 of the display panel DP may be disposed on the second support surface SUF2 of the stage ST. The second support surface SUF2 may support the display panel DP in the third direction DR3.

The clamper CLP may be disposed on the first surface S1 of the display panel DP. The clamper CLP may move in the first direction DR1 to the first support surface SUF1. The third support surface SUF3 of the clamper CLP may be in contact with the first surface S1 of the display panel DP. Consequently, the display panel DP may be supported by the first support surface SUF1 and the third support surface SUF3 in the horizontal direction and may be supported by the second support surface SUF2 in the vertical direction.

The handler HD may provide the circuit board COF on the first side surface SF1 of the display panel DP. The body BO of the handler HD may be disposed on the upper surface of the circuit board COF. Substantially, the upper surface of the circuit board COF may be the upper surface of the flexible circuit board FPC illustrated in FIG. 3. The handler HD may fix the circuit board COF. For example, the handler HD may vacuum-adsorb the circuit board COF through the suction holes SH defined in the lower surface BF of the body BO.

The handler HD may move back and forth in the first direction DR1 or the third direction DR3. The handler HD may first align the circuit board COF such that the second area AE2 of the circuit board COF overlaps the first area AE1 of the display panel DP.

In this case, a slight misalignment may exist between the second area AE2 and the first area AE1. For example, an offset may exist between the second mark MK2 defined in the second area AE2 and the first mark MK1 defined in the first area AE1. This is due to a sagging phenomenon that occurs at an end of the second area AE2 of the circuit board COF having flexibility.

Figure 6:
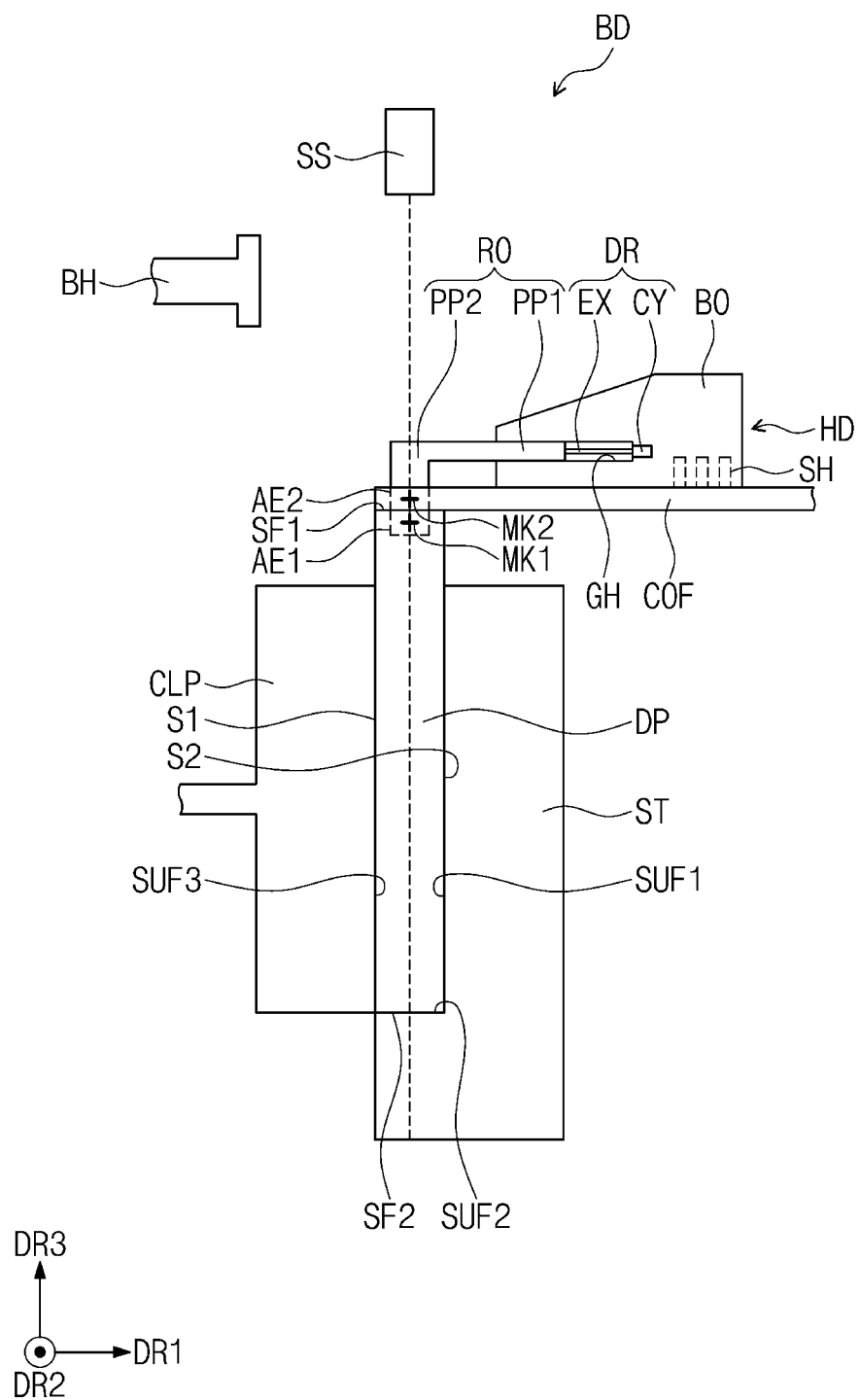
Figure 7:
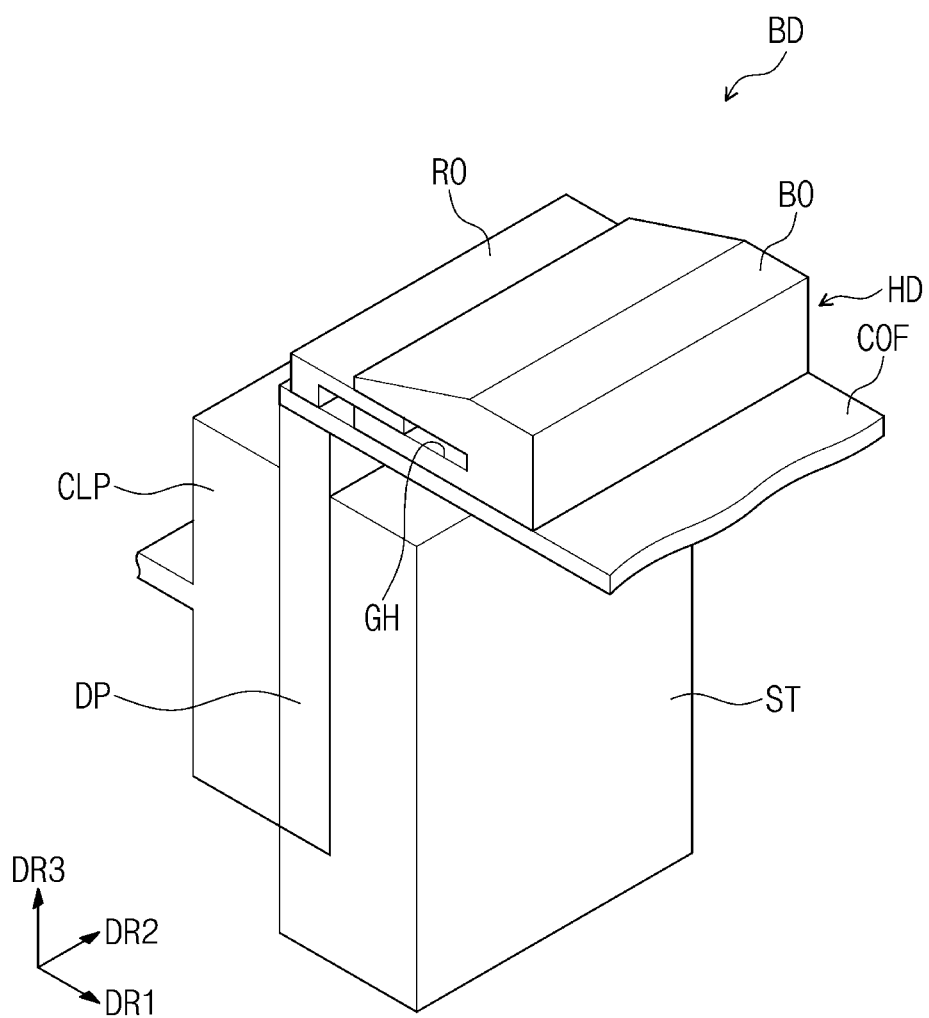

Referring to FIGS. 6 and 7, the rod RO of the handler HD may be selectively in contact with the upper surface of the second area AE2 and may control the misalignment between the second area AE2 and the first area AE1.

In more detail, the driver DR may move the first portion PP1 of the rod RO to a left side. Accordingly, the second portion PP2 of the rod RO may be in contact with the upper surface of the second area AE2. The end portion of the second area AE2 may be straightened to be substantially parallel to the first side SF1 of the display panel DP due to the contact of the second portion PP2. Therefore, the second area AE2 of the circuit board COF may be accurately disposed on the first area AE1.

Because the second portion PP2 of the rod RO includes the transparent material, the sensor SS may take a picture of the object disposed under the second portion PP2. When viewed from the sensor SS, the second mark MK2 and the first mark MK1 may overlap each other.

According to the embodiment, when the second portion PP2 of the rod RO comes in contact with the upper surface of the second area AE2, the bonding device BD may more accurately align the second area AE2 in the first area AE1. Accordingly, the bonding device BD may perform a more complete and accurate bonding process, and thus, a defective rate of the display device may be reduced.

According to the embodiment of the inventive concepts, because the rod RO includes the transparent material, the second area AE2 of the circuit board COF and the first area AE1 of the display panel DP may be substantially simultaneously photographed through one sensor SS. Therefore, the sensor SS may be easily set, and it is easy to check whether the display panel DP and the circuit board COF are aligned with each other.

Figure 8:
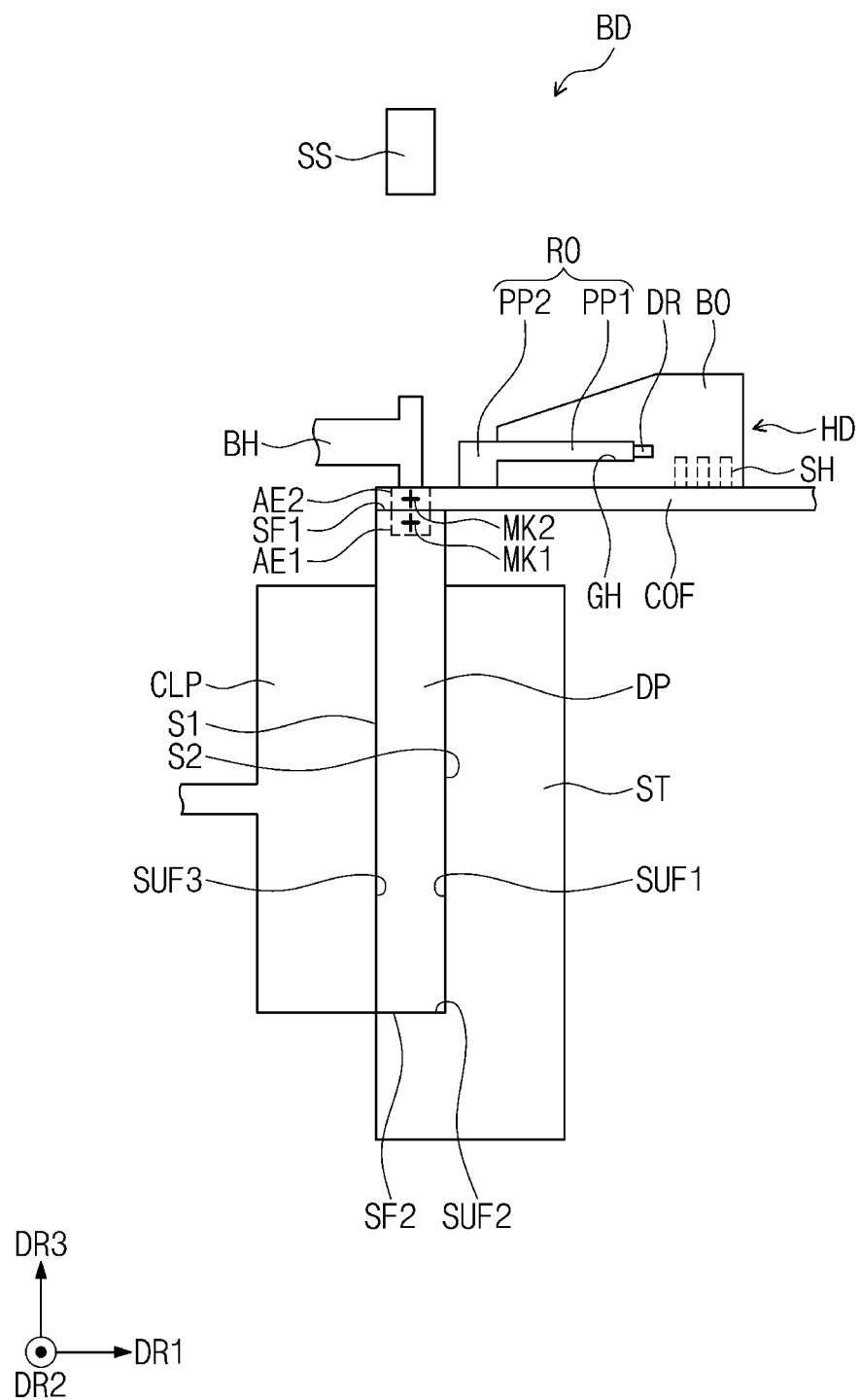

Referring to FIG. 8, the rod RO may return to its original position. In detail, the driver DR may move the first portion PP1 of the rod RO to a right side. Accordingly, the second portion PP2 of the rod RO may not overlap the sensor SS. Then, the bonding head BH may move to the upper surface of the second area AE2. The bonding head BH may be in contact with the upper surface of the second area AE2. The bonding head BH may bond the circuit board COF to the first side surface SF1 of the display panel DP. As described above, the bonding head BH may perform the bonding process using one of a thermal-compression method, an ultrasonic method, and a laser beam method.

When the above-described bonding process is completed, the display panel DP provided with the circuit board COF that is bonded to the side surface thereof may be transferred to the outside of the bonding device BD. Then, the bonding process may be performed on another display panel.

Figure 9:
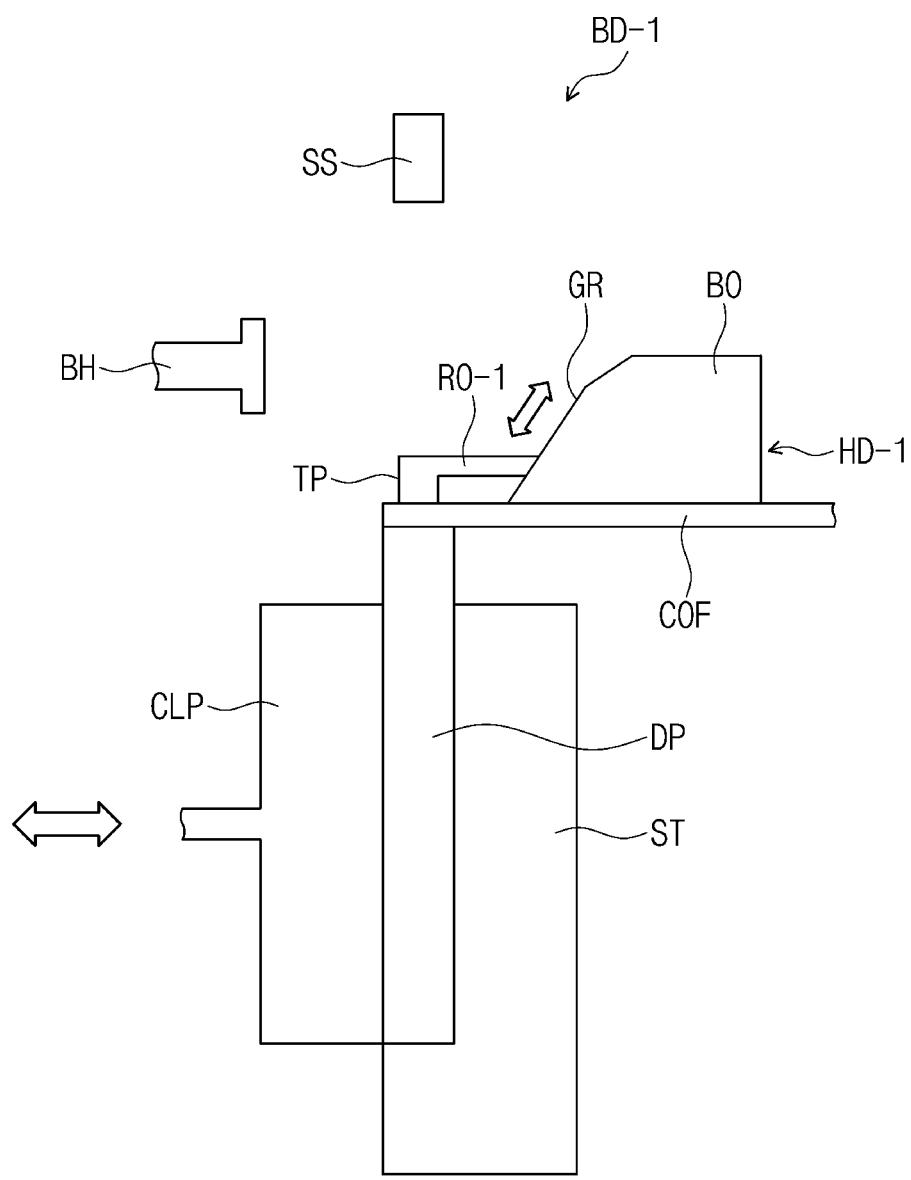
FIG. 9 and FIG. 10 are views illustrating a bonding device according to an embodiment of the inventive concepts.
Figure 10:
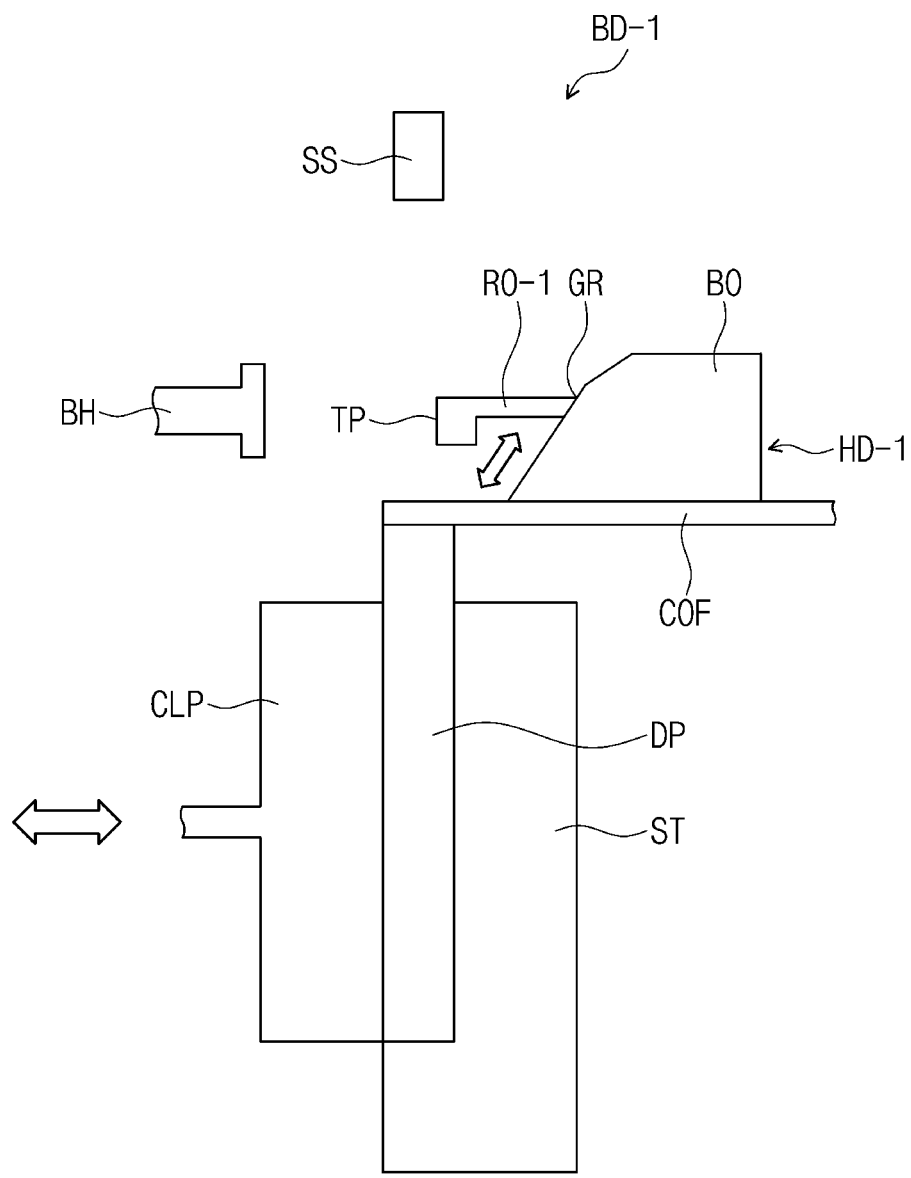

FIGS. 9 and 10 are views illustrating a bonding device BD-1 according to an embodiment of the inventive concepts. In FIGS. 9 and 10, the same reference numerals denote the same elements in the above-described embodiments. Thus, detailed descriptions of the same elements will be omitted, and different features will be mainly described.

Referring to FIGS. 9 and 10, a rod RO-1 of a handler HD-1 may move in an inclined direction. In detail, a body BO-1 may include a guide rail GR. The guide rail GR may be disposed on a side surface of the body BO-1. The guide rail GR may be inclined with respect to a horizontal direction. The guide rail GR may extend upwardly toward a right side as illustrated in FIG. 9.

The rod RO-1 may be connected to the body BO-1 and may move on the guide rail GR. For example, a contact tip TP of the rod RO-1 may move in the inclined direction along the guide rail GR. When the rod RO-1 is disposed at a lower portion of the guide rail GR in the third direction DR3, the contact tip TP (the second portion PP2 of FIG. 4) of the rod RO-1 may be in contact with an upper surface of the circuit board COF. When the rod RO-1 is disposed at an upper portion of the guide rail GR in the third direction DR3, the contact tip TP of the rod RO-1 may be spaced apart from the circuit board COF.

According to the present embodiment, as the contact tip TP of the rod RO-1 moves in the inclined direction, a position of the circuit board COF may be prevented from being dislocated due to the movement of the rod RO-1.

Although the embodiments of the inventive concepts have been described, it is understood that the inventive concepts should not be limited to these embodiments but various changes and modifications can be made by one ordinary skilled in the art within the spirit and scope of the inventive concepts as hereinafter claimed. Therefore, the disclosed subject matter should not be limited to any single embodiment described herein, and the scope of the present inventive concept shall be determined according to the attached claims.

What is claimed is:

1. A bonding device comprising:
   a stage supporting a display panel having a first area through which a pad is exposed;
   a sensor disposed on the stage and facing the first area; and
   a handler disposing a circuit board on the first area, the handler including:
   a body supporting the circuit board; and
   a rod connected to the body and being selectively in contact with a second area of the circuit board overlapping the first area, wherein
   the display panel has a first surface, a second surface opposite the first surface, and a side surface substantially perpendicular to the first surface and the second surface, wherein the first area is defined in the side surface,
   the stage overlaps the first surface and the second surface,
   the stage does not overlap the side surface, and
   the rod comprises a transparent material.

2. The bonding device of claim 1, wherein the body is disposed on an upper surface of the circuit board.

3. The bonding device of claim 2, wherein the body is provided with a plurality of suction holes defined in a lower surface thereof.

4. The bonding device of claim 2, wherein the rod comprises:
   a first portion extending in a horizontal direction substantially parallel to the upper surface of the circuit board; and
   a second portion extending in a vertical direction substantially perpendicular to the horizontal direction from the first portion.

5. The bonding device of claim 4, wherein the body is provided with a guide groove defined therein and extending in the horizontal direction, and the first portion is inserted into the guide groove and moves in the guide groove.

6. The bonding device of claim 4, wherein the rod further comprises a driver that moves the rod in the horizontal direction.

7. The bonding device of claim 4, wherein the body comprises a guide rail inclined at a predetermined angle with respect to the horizontal direction, and the rod moves on the guide rail.

8. The bonding device of claim 1, further comprising a bonding head disposed on the stage, wherein the bonding head is in contact with an upper surface of the second area to connect the circuit board to the display panel.

9. The bonding device of claim 8, wherein the bonding head applies ultrasonic waves to between the second area and the first area.

10. The bonding device of claim 9, further comprising a clamper having a support surface facing the first support surface, wherein the clamper moves to be close to or far away from the first support surface.

11. The bonding device of claim 1, wherein the stage comprises a first support surface on which a plane vertical to the side surface of the display panel is disposed.

12. A bonding device comprising:
    a stage having a support surface extending in a vertical direction;
    a camera disposed on the stage; and
    a handler disposed between the stage and the camera, the handler including:

a body; and a contact tip connected to the body and moving in one direction to be disposed on the stage, the contact tip comprising a transparent material.

13. The bonding device of claim 12, wherein the body is provided with a plurality of suction holes defined in a lower surface thereof.

14. The bonding device of claim 12, wherein the contact tip moves in a horizontal direction substantially perpendicular to the vertical direction.

15. The bonding device of claim 12, wherein the contact tip moves in a direction inclined at a predetermined angle with respect to the vertical direction.

16. The bonding device of claim 12, further comprising a bonding head disposed on the stage and applying ultrasonic waves to a target object disposed on the stage.

17. The bonding device of claim 12, wherein the camera takes a picture of a mark defined in a target object disposed on the stage.

18. A bonding device comprising:
a stage supporting a display panel having a first area through which a pad is exposed;
a sensor disposed on the stage and facing the first area; and
a handler disposing a circuit board on the first area, the handler including:
a body supporting the circuit board; and
a rod connected to the body and being selectively in contact with a second area of the circuit board overlapping the first area,
wherein the display panel has a first surface, a second surface opposite the first surface, and a side surface substantially perpendicular to the first surface and the second surface, wherein the first area is defined in the side surface,
wherein the stage overlaps the first surface and the second surface,
wherein the stage does not overlap the side surface, and
wherein the body is provided with a plurality of suction holes defined in a lower surface thereof.

* * * * *